United States Patent
Lee et al.

(10) Patent No.: US 10,783,944 B2
(45) Date of Patent: Sep. 22, 2020

(54) MAGNETIC MEMORY AND A METHOD OF OPERATING MAGNETIC MEMORY

(71) Applicant: National University of Singapore, Singapore (SG)

(72) Inventors: Jongmin Lee, Singapore (SG); Rajagopalan Ramaswamy, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 16/265,451

(22) Filed: Feb. 1, 2019

(65) Prior Publication Data
US 2019/0244646 A1    Aug. 8, 2019

(30) Foreign Application Priority Data

Feb. 2, 2018 (SG) .......................... 10201800918W

(51) Int. Cl.
| G11C 11/00 | (2006.01) |
| G11C 11/16 | (2006.01) |
| H01L 43/02 | (2006.01) |
| H01F 10/32 | (2006.01) |
| H01L 27/22 | (2006.01) |

(52) U.S. Cl.
CPC ........ *G11C 11/161* (2013.01); *G11C 11/1659* (2013.01); *G11C 11/1673* (2013.01); *G11C 11/1675* (2013.01); *H01F 10/329* (2013.01); *H01F 10/3254* (2013.01); *H01L 27/222* (2013.01); *H01L 43/02* (2013.01)

(58) Field of Classification Search
CPC ............. G11C 11/161; G11C 11/1659; G11C 11/1673; G11C 11/1675; H01F 10/3254; H01F 10/329; H01L 27/222; H01L 43/02
USPC ........................................................ 365/158
See application file for complete search history.

(56) References Cited

U.S. PATENT DOCUMENTS

| 9,236,565 B2 | 1/2016 | Loong et al. |
| 9,741,414 B2 | 8/2017 | Qiu et al. |

(Continued)

OTHER PUBLICATIONS

Emori, Satoru, et al., "Current-driven Dynamics of Chiral Ferromagnetic Domain Walls," Macmillan Publishers Limited, Letters, Nature Materials, Jun. 16, 2013, pp. 1-6.

(Continued)

*Primary Examiner* — Harry W Byrne
(74) *Attorney, Agent, or Firm* — Cesari and McKenna, LLP; James A. Blanchette

(57) ABSTRACT

In example embodiments, a SOT magnetic memory and operation method are provided that utilize SOT driven domain wall motion to achieve subsequent switching without the need for an external assist magnetic field. The magnetic memory includes a magnetic tunnel junction having a reference layer, a tunnel barrier layer and a free layer, where the tunnel barrier layer is positioned between the reference layer and free layer. A spin-orbit torque layer is disposed adjacent to the free layer. A pair of pinning site are positioned at a longitudinal end of the free layer and each has an opposite magnetization direction from the other. The SOT layer is configured to exert SOT and switch a magnetization direction of the free layer via domain wall motion in a direction of current flow when an electric current is passed through a length of the SOT layer.

14 Claims, 9 Drawing Sheets

(56) References Cited

U.S. PATENT DOCUMENTS

| | | |
|---|---|---|
| 10,115,443 B2 | 10/2018 | Yoon et al. |
| 2016/0197263 A1* | 7/2016 | Hu .......................... H01L 43/02 365/158 |
| 2017/0200486 A1 | 7/2017 | Qiu et al. |
| 2017/0279038 A1 | 9/2017 | Wu et al. |

OTHER PUBLICATIONS

Haazen, P.P.J., et al., "Domain Wall Depinning Governed by the Spin Hall Effect," Macmillan Publishers Limited, Letters, Nature Materials, vol. 12, Feb. 3, 2013, pp. 299-303.

Liu, Luqiao, et al., "Spin-Torque Switching with the Giant Spin Hall Effect of Tantalum," Science, vol. 336, Issue 6081, May 4, 2012, pp. 1-31.

Miron, Ioan Mihai, et al., "Perpendicular Switching of a Single Ferromagnetic Layer Induced by In-plane Current Injection.," Macmillan Publishers Limited, Letter, Nature, vol. 476, Aug. 11, 2011, pp. 189-194.

\* cited by examiner

FIGS. 8a-h
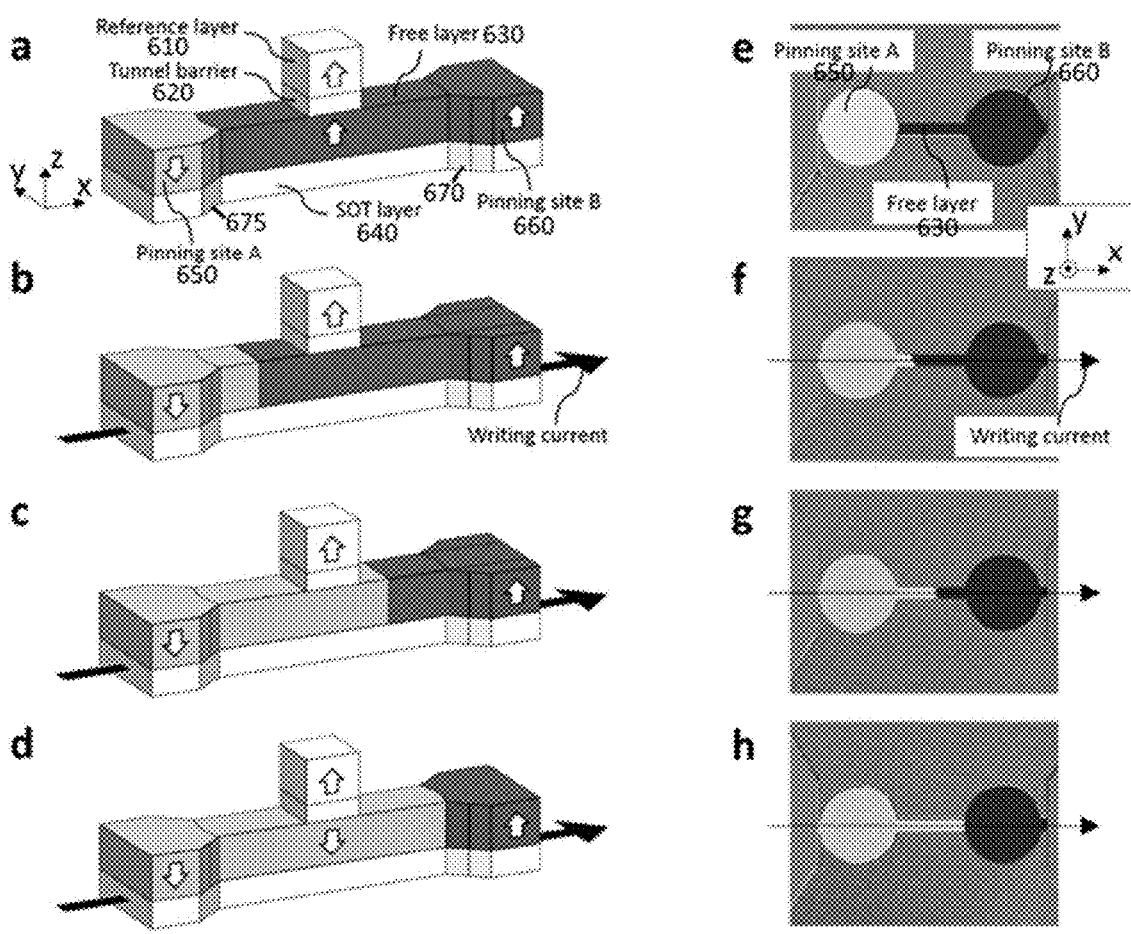

FIGS. 9a-h
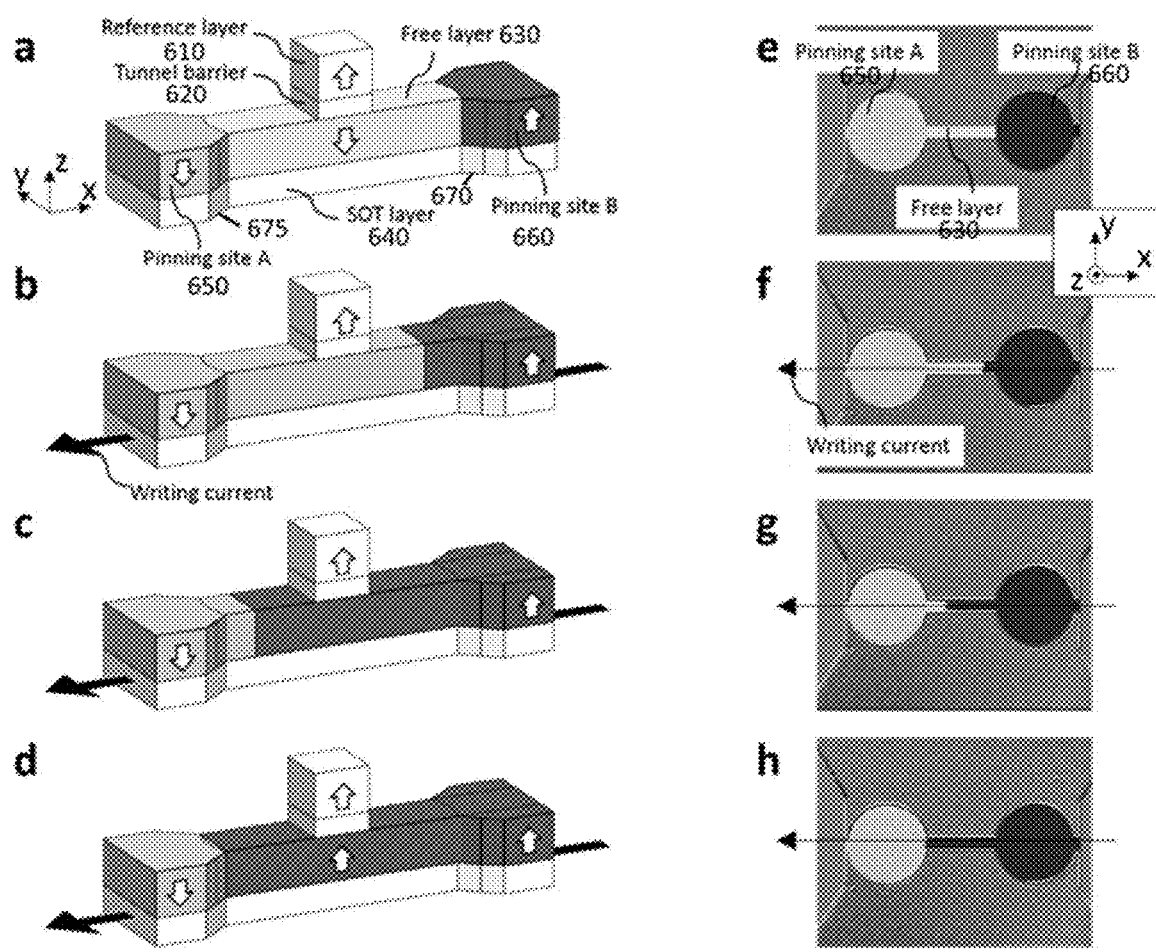

MAGNETIC MEMORY AND A METHOD OF OPERATING MAGNETIC MEMORY

RELATED APPLICATIONS

The present application claims priority to Singapore Patent Application No. 10201800918W, titled "Magnetic Memory and a Method of Forming Magnetic Memory," filed by Applicant National University of Singapore on Feb. 2, 2018, the contents of which are incorporated by reference herein in their entirety.

BACKGROUND

Technical Field

The present disclosure relates generally to magnetic memory and more specifically to magnetic memory that utilizes a spin-orbit torque (SOT) writing scheme without an assist magnetic field.

Background Information

Magnetic memory (e.g., magnetic random access memory (MRAM)) is a type of non-volatile memory technology with a high operation (read and write) speed. In contrast to other memory technologies, which use electric charges or current flow to store binary data and are therefore volatile, magnetic memory uses magnetic elements to store binary data, which do not degrade over time, giving non-volatile characteristics. In addition, magnetic memory exhibits low power consumption and is suited for high-speed operation. Accordingly, magnetic memory is a promising candidate for use as a universal memory (i.e. a memory that has multiple desirable properties typically only found in different memory types).

Generally, magnetic memory includes a magnetic tunnel junction (MTJ) and electrical current lines. A MTJ generally includes a tunnel layer and two magnetic layers, namely, a free layer and a reference layer. The magnetization direction of the reference layer is generally fixed, while that of the free layer is generally switchable between two stable states. The electrical resistance of a MTJ is sensitive to the relative magnetization alignment between the free layer and the reference layer. Using this property, binary information can be written to a magnetic memory by switching the magnetization direction of the free layer, and later read therefrom based on electrical resistance. For example, a high electrical resistance from an anti-parallel alignment between the free layer and the reference layer can represent a binary "1", and a low electrical resistance from a parallel alignment between the free layer and the reference layer can represent a binary "0".

Conventionally, in a magnetic memory, spin-transfer torque (STT) is used to switch the magnetization direction of the free layer. FIG. 1 is a schematic diagram of a conventional MTJ 100 that utilizes a STT writing scheme. The MTJ includes a reference layer 120 separated from a free layer 140 by a tunnel barrier 130. A write line 150 is adjacent to the free layer 140 and a bit line is adjacent to the reference layer 120. The magnetization direction of the reference layer 120 is fixed (e.g., in the "up" direction in FIG. 1) and that of the free layer 140 can be switched between two states (e.g., "up" or "down" direction in FIG. 1) by applying a positive or negative writing current across the MTJ 100. A reading current, which senses the MTJ electrical resistance from the relative alignment of the two magnetic layers, also flows across the MTJ 100. Since the writing and reading current share the same path, a STT magnetic memory is typically a two-terminal memory.

Conventional STT switched magnetic memories, such as shown in FIG. 1 may suffer several issues. Since the writing and reading currents flow along the same path, a STT switched magnetic memories may suffer from the issue of read disturb, i.e. the inadvertent switching of a free layer from a reading current. Moreover, repeated application of a large writing current across a MTJ may cause the tunnel barrier to breakdown, which eventually destroys the MTJ of a STT switched magnetic memory.

In an attempt to mitigate these issues, spin-orbit torque (SOT) writing schemes have been proposed. FIG. 2 is a schematic diagram of a conventional MTJ 200 that uses a SOT writing scheme Like a STT magnetic memory, the SOT magnetic memory includes a reference layer 120 separated from a free layer 140 by a tunnel barrier 130. However, a SOT layer is disposed adjacent to the free layer 140. In contrast to a STT writing scheme where the writing current is applied across the MTJ, a SOT writing current is not applied across the MTJ, but along a SOT layer 250. The SOT layer 250 is configured to exert SOT on the free layer 140 when a current is passed through the SOT layer 250. The exerted SOT may switch the free layer 140 (e.g., to an "up" or "down" direction in FIG. 2). The reference layer 120 is fixed in one direction (e.g., in the "up" direction in FIG. 2). Since the writing current and the reading current paths are separated, SOT magnetic memory is typically three-terminal memory, and may be free from the issue of read disturb. Further, since the writing current does not flow across the MTJ, the issue of tunnel barrier breakdown may be avoided. These aspects, in addition to an ability to achieve high-speed operation, low power consumption, and non-volatile characteristics, make a SOT magnetic memory a promising candidate for universal memory.

Despite the characteristic described above, however, conventional SOT magnetic memories are not perfect. In a conventional SOT writing scheme, not only the writing current, but also an external assist magnetic field, is necessary to deterministically switch the magnetization direction of a free layer, especially for magnetic layers with perpendicular magnetic anisotropy (PMA) that are required for high-density applications. However, applying an assist magnetic field requires additional components and added complexity. A reliable SOT writing scheme without the need of an assist magnetic field could greatly increase the density and scalability of magnetic memory devices, as applying magnetic field typically requires additional, complex circuits/components.

Some attempts have been made to develop a SOT writing scheme that does not need of an assist magnetic field. In the conventional STT and SOT magnetic memories depicted in FIGS. 1 and 2), STT or SOT induced rotational motion of magnetization in the free layer 140 is utilized to achieve the switching. Attempts have been made to instead use current induced domain wall motion driven by SOT to switch the magnetization direction of a free layer 140. The domain walls in PMA magnetic layers may be driven solely by the current flow in an adjacent SOT layer and do not require an external assist magnetic field. The domain wall motion direction depends on the current polarity and the spin-orbit interaction in a SOT layer (e.g., the domain wall can move along or against current flow direction depending on the SOT layer configuration). Therefore, the magnetization of a domain wall device may be switched by current induced domain wall motion, and the resultant domain expansion, in the absence of an external assist magnetic field.

However, using conventional techniques, current induced domain wall motion cannot be used to subsequently switch magnetization direction of a free layer (e.g., from an "up" to a "down" direction, and then, subsequently, from a "down" to an "up" direction, or vice versa), and therefore is not practical for a commercial magnetic memory.

FIGS. 3a-3d are a progression of schematic diagrams showing a conventional switching technique that uses current induced domain wall motion driven by SOT, and showing limitations thereof. Once a domain wall is created within a free layer, the magnetization direction can be switched into one direction from SOT driven domain wall motion. Referring to FIGS. 3a-3c, it can be seen that applying a positive current along the SOT layer 250 results in an "up" to "down" magnetization direction switch in the free layer 140. However, as the domain wall is annihilated after the switching, applying opposite polarity current does not lead to subsequent switching into the opposite direction. Referring to FIG. 3d, the magnetization direction is not switched back to the "up" state, but it remains in the "down" state when a negative current is applied along the SOT layer 250. As can be seen, using conventional techniques, current induced domain wall motion can cause a switching event without an assist magnetic field, but only a single switching event, making it impractical for a commercial magnetic memory.

FIG. 4 is a graph 400 showing an example of a series of applied currents with opposite polarities and corresponding MTJ resistance change for a conventional current induced domain wall motion device. As can be seen again, only a single MTJ resistance change occurs, and therefor only one switching event.

Accordingly, there is a need for new devices and methods that may address at least one of the above noted problems.

SUMMARY

In example embodiments, a three-terminal SOT magnetic memory and operation method are provided that utilize SOT driven domain wall motion to achieve subsequent switching without the need for an external assist magnetic field. The magnetic memory includes a MTJ having a reference layer, a tunnel barrier layer and a free layer, where the tunnel barrier layer is positioned between the reference layer and the free layer. A SOT layer is disposed adjacent to the free layer. A pair of pinning site are positioned at a longitudinal end of the free layer and each has an opposite magnetization direction from the other. The SOT layer is configured to exert SOT and switch a magnetization direction of the free layer via domain wall motion in a direction of current flow, when an electric current is passed through a length of the SOT layer. Example embodiments of the present disclosure provide reliable, subsequent switching even in the absence of an external assist magnetic field. Since an assist magnetic field typically requires additional complex components, example embodiments of the present disclosure may advantageously greatly increase the density and scalability of magnetic memory.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIGS. 8a-8d are a progression of schematic diagrams showing an example writing process using spin-orbit interaction in the absence of an external assist-field, using the example embodiment of FIG. 6;

FIGS. 8e-h are contrast enhanced magneto-optic Kerr effect images that show an example writing processes similar to FIGS. 8a-8d, now in a specific example device;

FIGS. 9a-9d are a progression of schematic diagrams showing another example writing process using spin-orbit interaction in the absence of an external assist-field, using the example embodiment of FIG. 6; and FIGS. 9e-h are contrast enhanced magneto-optic Kerr effect images that show an example writing processes similar to FIGS. 9a-9d, now in a specific example device.

DETAILED DESCRIPTION

Definitions

As used herein, the term "substrate" should be interpreted broadly to refer to a structure to which one or more materials, or one or more layers of material, may be deposited thereon. A substrate may include the one or more layers of material deposited thereon. A substrate may comprise a wafer comprising one or more layers of material such as, but not limited to, e.g. dielectric layers, metal layers, etc.

As used herein, the term "layer", when used to describe a structure, should be interpreted broadly to refer to a level or thickness of the structure that is distinguishable from another level or thickness of another structure. A layer may comprise the same, or different materials, from the other structure. The layer and the other structure may be the same or different in properties (e.g., size, shape, etc.), as long as they are distinguishable from each other. A layer is not limited to a single material, but may comprise one or more sub-layers or intermediate layers of one or more materials, which may themselves also be distinguishable from adjacent layers. When a layer is formed by individual sub-layers or intermediate layers, the dimensions of each of individual sub-layer or intermediate layer may be the same or different.

As used herein, the terms "coupled" or "connected" are intended to cover both directly connected, or connected through one or more intermediate structures, unless otherwise stated.

As used herein, the term "adjacent", when referring to two elements, should be interpreted to refer to one element being in close proximity to another element. Adjacent elements may contact each other, but the term shall not be limited to contact. Adjacent elements may also be elements separated by one or more further elements that are disposed therebetween.

As used herein, the term "and/or" (e.g., as in "X and/or Y") should be interpreted to mean either "X and Y" or "X or Y", and should be taken to provide explicit support for both meanings or for either meaning.

Further, as used herein, the term "substantially" should be understood to include, "entirely" or "completely", and also to include within a reasonable variation, defined as, a variation of no more than +/−5% when in reference to a value. Further, as used herein, the terms "about" and "approximately" should be understood to mean within a reasonable variation, defined as a variation of no more than +/−5% when in reference to a value.

Example Embodiments

In one example embodiment, a SOT magnetic memory and associated operation method are provided that utilize SOT driven domain wall motion to achieve subsequent switching without the need for an external assist magnetic field.

Figure 4:
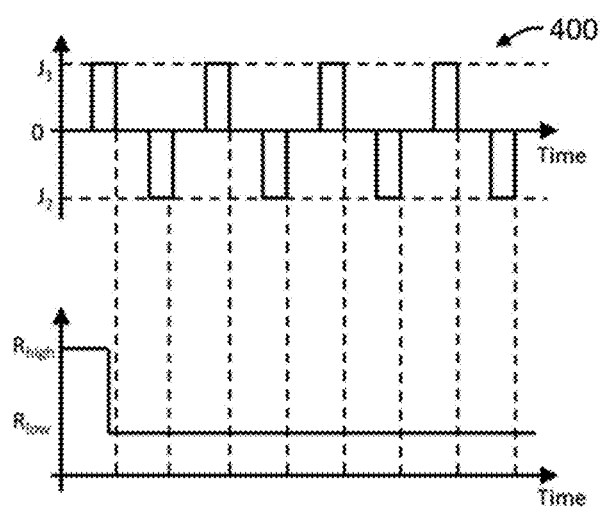
FIG. 4 is a graph showing an example of a series of applied currents with opposite polarities and corresponding MTJ resistance change, for a conventional current induced domain wall motion device.
Figure 5:
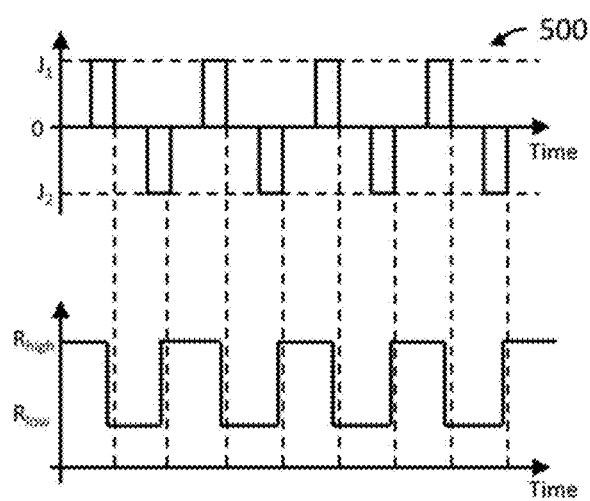
FIG. 5 is a graph showing an example of a series of applied currents with opposite polarities and corresponding MTJ resistance change, for an example magnetic memory based on SOT driven domain wall motion.

FIG. 5 is a graph 500 showing an example of a series of applied current with opposite polarities and corresponding MTJ resistance change for an example magnetic memory based on SOT driven domain wall motion. In contrast to FIG. 4, one can see subsequent switching events with repeated MTJ resistance change in response to polarity changes of the applied current.

Figure 6:
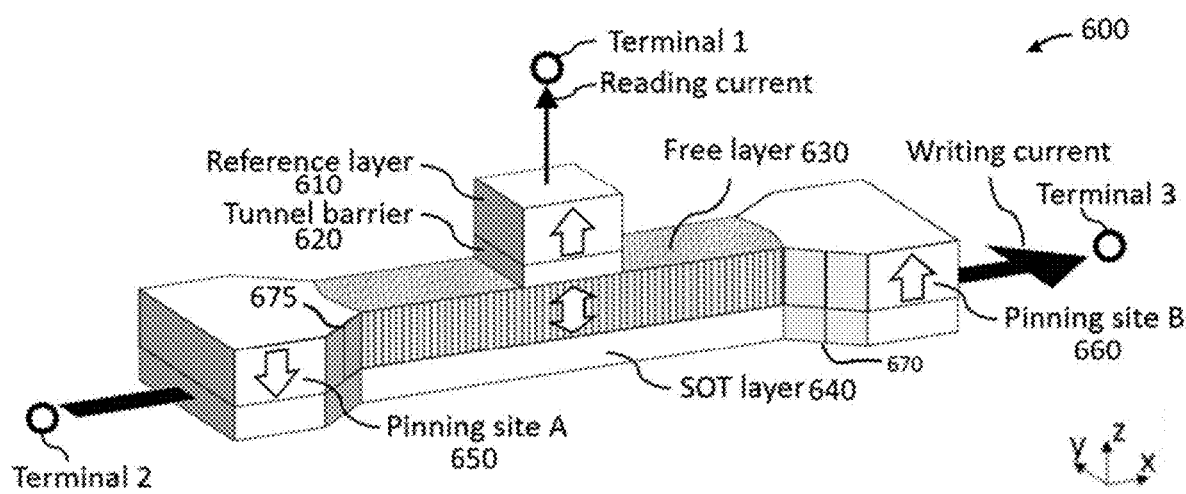
FIG. 6 is a schematic diagram showing a first example embodiment of a MTJ that may be subsequently switched using SOT driven domain wall motion in the absence of an external assist magnetic field.

FIG. 6 is a schematic diagram showing a first example embodiment of a MTJ 600 that may be subsequently switched using SOT driven domain wall motion in the absence of an external assist magnetic field. In this example, the MTJ 600 is part of a three-terminal SOT magnetic memory. For clarity, it should be understood that FIG. 6 is not to scale and that the selection devices, such as transistors or diodes, are not shown. The MTJ 600 includes a reference layer 610, a tunnel barrier 620, and a free layer 630. A SOT layer 640 is positioned to be adjacent to the free layer 630 and is configured to exert SOT on the free layer 630 when the writing current is applied through the SOT layer 640. The magnetization of the free layer 630 may be switched via SOT driven domain wall motion (e.g., from an "up" to a "down" direction, and vice versa, in FIG. 6), while the magnetization of the reference layer 610 is fixed (e.g., the magnetization direction is "up" in FIG. 6). The free layer 630 and the reference layer 610 are depicted as a single layer in FIG. 6. However, it should be understood that the free layer 630 and the reference layer 610 may be configured as multilayers, for example, as one or more magnetic layers and one or more nonmagnetic layers.

In the first example embodiment shown in FIG. 6, the free layer 630 and the SOT layer 640 are designed to have tapered widths, when viewed from an overhead perspective (i.e., when viewed from along a z-axis normal to the layers 610-630 of the MTJ 600 that fall in an x-y plane). The tapered width is formed to provide at least two pinning sites (pinning site A 650 and pinning sight B 660) at longitudinal ends of a free layer 630 (i.e. at end along the x-axis). The pinning sites 650, 660 are connected by tapered regions 670, 675 to a narrower portion of the free layer 630 (and in this example, also the SOT layer 640) disposed therebetween. The magnetization in the two pinning sites 650, 660 are in opposite directions (e.g., the magnetization direction of pinning site A 650 is "down" and magnetization direction of the pinning site B 660 is "up" in FIG. 6). The tapered regions 670, 675 or the pinning sites 650, 660 may stop domain wall propagation.

Figure 7:
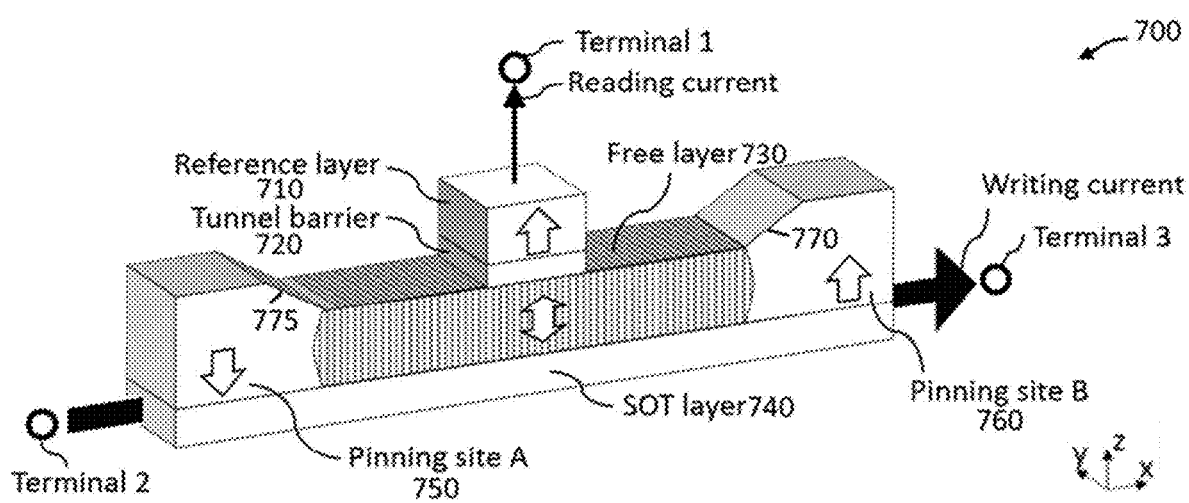
FIG. 7 is a schematic diagram showing a second example embodiment of a MTJ that may be subsequently switched using SOT driven domain wall motion in the absence of an external assist magnetic field.

FIG. 7 is a schematic diagram showing a second example embodiment of a MTJ 700 that may be subsequently switched using SOT driven domain wall motion in the absence of an external assist magnetic field. In this example, the MTJ 700 is part of a three-terminal SOT magnetic memory. For clarity, it should be understood that FIG. 7 is not to scale and that the selection devices, such as transistors or diodes, are not shown. The MTJ 700 includes a reference layer, 710 a tunnel barrier 720, and a free layer 730. A SOT layer 740 is positioned to be adjacent to the free layer 730 and is configured to exert SOT on the free layer 730 when writing current is applied through the SOT layer 740. The magnetization of the free layer 730 can be switched via SOT driven domain wall motion (e.g., from an "up" to a "down" direction, and vice versa, in FIG. 7), while the magnetization of the reference layer 710 is fixed (e.g., the magnetization direction is "up" in FIG. 7). The free layer 730 and the reference layer 710 are depicted as a single layer FIG. 7. However, it should be understood that the free layer 730 and the reference layer 710 may be configured as multilayers, for example, as one or more magnetic layers and one or more nonmagnetic layers.

In the second example embodiment shown in FIG. 7, the free layer 730 and the SOT layer 740 are designed to have tapered thicknesses, when viewed from a side perspective (i.e., from along a y-axis parallel to the layers 710-730 of the MTJ 700 that fall in a x-y plane). The tapered thickness is formed to provide at least two pinning sites (pinning site A 750 and pinning sight B 760) at longitudinal ends of free layer 730 (i.e. i.e. at end along the x-axis). The pinning sites 750, 760 are connected by tapered regions 770, 775 to a narrower portion of the free layer 730 disposed therebetween. The magnetization in the two pinning sites 750, 760 are in opposite directions (e.g., magnetization direction of the pinning site A 750 is "down" and magnetization direction of the pinning site B 760 is "up" in FIG. 7). The tapered regions 770, 775 or the pinning sites 750, 760 may stop domain wall propagation.

It should be understood that tapered width as shown in the first example embodiment of FIG. 6, and tapered thickness as shown in the second example embodiment of FIG. 7, may be used individually, or combined in the same SOT magnetic memory. As shown in both FIG. 6 and FIG. 7, an example SOT magnetic memory may include three terminals, e.g., terminal 1, terminal 2, and terminal 3. A reading current may be applied across the MTJ 600, 700 between terminal 1 and terminal 2 or between terminal 1 and terminal 3. To write the SOT magnetic memory, a writing current is applied through the SOT layer 640, 740 between terminal 2 and terminal 3. The applied writing current results in SOT which is exerted on the free layer 630, 730, and the free layer can be switched between two magnetization directions (e.g., from an "up" to a "down" direction, and vice versa). The switching direction is determined by a combination of the applied current polarity and the magnetization direction in the pinning sites 650-660, 750-760.

FIGS. 8a-8d are a progression of schematic diagrams showing an example writing process using spin-orbit interaction in the absence of an external assist-field, using the example embodiment of FIG. 6. The magnetization direction of the free layer 630 is switched from "up" (along the +z-direction) to "down" (along the −z-direction) under a positive applied current (in the +x-direction). FIG. 8a shows the magnetization direction of each element before applying the writing current. In this example, the magnetization directions of the pinning site A 650 and the pinning site B 660 is in the "down" and "up" directions, respectively, and the magnetization direction of the free layer 630 is in the "up" direction. Therefore, a domain wall is formed in the tapered region 675 between pinning site A 650 and the free layer 630. When positive writing current is applied along the SOT layer 640, a SOT or an equivalent SOT field is exerted on the domain wall, which pulls the nearby magnetic domains to "down". Therefore, under the writing current, the "down" domain expands and the "up" domain shrinks, which results in domain wall motion along the current flow direction (in the +x-direction) as shown in FIGS. 8b, 8c, and 8d.

When the domain wall reaches another tapered region 670 on the opposite end (near pinning site B 660) of the free layer 630, the switching process is completed and the magnetization direction of the free layer 630 is switched from "up" to "down". Because of the non-homogeneous magnetic anisotropy and the non-uniform current density arising from the tapered region 670 of the free layer 630 and the SOT layer 640, the domain wall does not move toward the pinning site 660, but is pinned at the tapered region 670 between the pinning site B 660 and the narrower portion of the free layer 630, as shown in FIG. 8d. Therefore, the domain wall does not annihilate, and is protected even after the switching process. The domain wall between the pinning site B 660 and the narrower portion of the free layer 630 can be used for subsequent reverse switching.

FIGS. 8e-h are contrast enhanced magneto-optic Kerr effect images that show an example writing processes similar to FIGS. 8a-8d, now in a specific example device constructed from Tantalum (Ta)/cobalt-iron-boron (CoFeB) alloy/magnesium oxide (MgO) layers. FIGS. 8e, 8f, 8g, and 8h correspond to the switching process in FIGS. 8a, 8b, 8c, and 8d, respectively. For this example device, a SOT layer of Ta (e.g., with a thickness of about 1 nm to about 30 nm, for example 6 nm), a free layer of $Co_{40}Fe_{40}B_{20}$ (with a thickness of about 0.7 nm to about 10 nm, for example 0.9 nm), a tunnel barrier of a MgO (with a thickness of about 0.6 nm to about 3 nm, for example, 2 nm) and a device protection layer of silicon dioxide ($SiO_2$) (with a thickness of about 1 nm to about 8 nm, for example, 3 nm) were prepared on a silicon (Si)/$SiO_2$ substrate by magnetron sputtering and annealed at 200° C. for 30 minutes. The structure has been patterned into a tapered nanowire using electron beam lithography and argon (Ar) ion etching. The nanowire serves as a free layer 630 and the tapered regions at two ends of the nanowire also act as pinning site A 650 and pinning site B 660.

Figure 1:
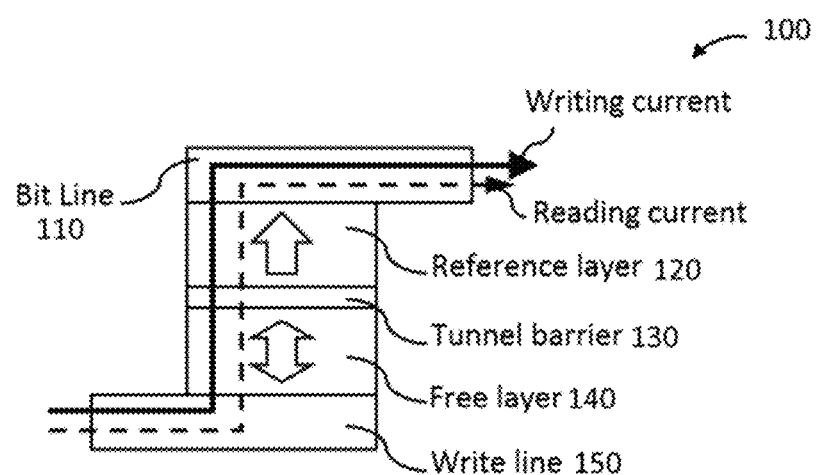
FIG. 1 is a schematic diagram of a conventional MTJ that utilizes a STT writing scheme.
Figure 2:
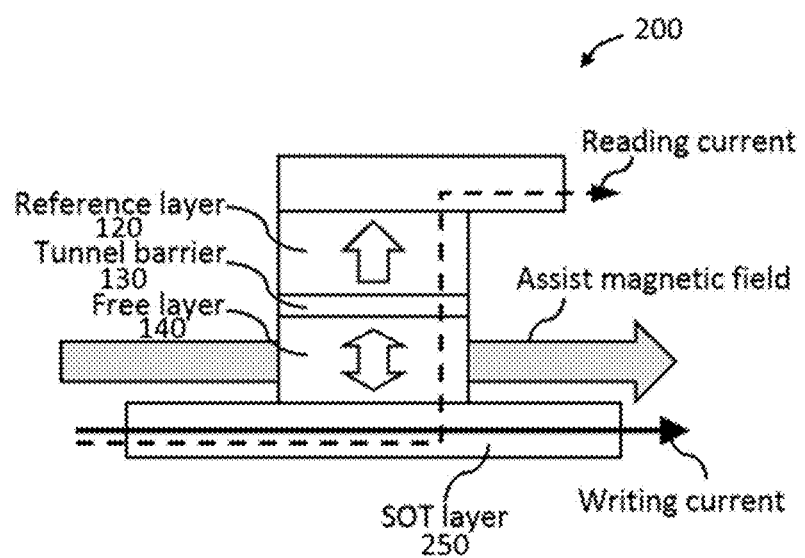
FIG. 2 is a schematic diagram of a conventional MTJ that uses a SOT writing scheme.
Figures 3A, 3B, 3C, 3D:
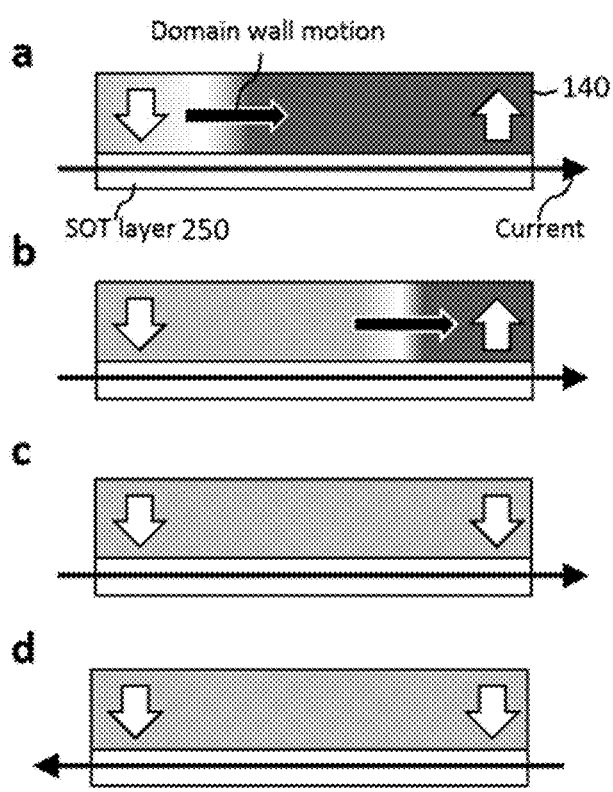
FIGS. 3a-3d are a progression of schematic diagrams showing a conventional switching technique that uses current induced domain wall motion driven by SOT, and showing limitations thereof.

FIG. 8e shows the magnetization direction of each element before applying the current. For this example writing process, the magnetization direction of the pinning site A 650 and the pinning site B 660 is in the "down" direction (indicated by light shading) and the "up" direction (indicated by dark), respectively, and the magnetization direction of the free layer 630 is in the "up" direction. With applying the positive writing current (in the +x-direction), the "down" domain expands and the "up" domain shrinks, which results in domain wall motion along the current flow direction, as shown in FIGS. 8f, 8g, and 8h. The current may be applied for a duration of 0.1 ns to 50 ns. When the domain wall reaches the tapered region on the opposite end of free layer 630, the switching process is completed and the free layer 630 is switched from "up" to "down". Further increasing the magnitude or duration of applied current does not move the domain wall toward the pinning site B 660. Therefore, the domain wall does not annihilate and is protected even after the switching process. This is in contrast to what occurs in a conventional device, where the domain wall is annihilated after a first switching process and is unavailable for subsequent switching, as discussed above in reference to FIG. 3.

FIGS. 9a-9d are a progression of schematic diagrams showing another example writing process using spin-orbit interaction in the absence of an external assist-field, using the example embodiment of FIG. 6. Here, the magnetization direction of the free layer 630 is switched from "down" (along the −z-direction) to "up" (along the +z-direction) under negative applied current (in the −x-direction). FIG. 9a shows the magnetization direction of each element before applying the current. The magnetization directions of the pinning site A 650 and the pinning site B 660 are in "down" and "up" directions, respectively, and the magnetization direction of the free layer 630 is in the "down" direction. Therefore, a domain wall is formed in the tapered region 670 between the pinning site B 660 and the narrower portion of the free layer 630. This writing process can be considered as an opposite switching process, compared the "up" to "down" switching process illustrated in FIG. 8, because the magnetization configuration before applying current (e.g., the magnetization configuration in FIG. 9a) is identical to the magnetization configuration after "up" to "down" switching (e.g., the magnetization configuration in FIG. 8d). When the negative writing current is applied along the SOT layer 640, a SOT or an equivalent SOT field is exerted on the domain wall, which pulls the nearby magnetic domains into the "up" state. Therefore, under the writing current, the "up" domain expands and the "down" domain shrinks, which results in the domain wall motion along the current flow direction, as shown in FIGS. 9b, 9c, and 9d.

When the domain wall reaches another tapered region 675 at the opposite end of the free layer 630 near pinning site A 650, the switching process is completed and the free layer 630 is switched from "down" to "up". Because of the non-homogeneous magnetic anisotropy and the non-uniform current density arising from the tapered region 675 of the free layer 630 and the SOT layer 640, the domain wall does not move toward the pinning site A 650, but is pinned at the tapered region 675 between the pinning site A 650 and the narrower portion of the free layer 630, as shown in FIG. 9d. By utilizing this domain wall and a negative applied current, the opposite "up" to "down" switching can be achieved again (e.g., as already described above in reference to FIG. 8), allowing the device to be repeatedly switched between states.

FIGS. 9e-h are contrast enhanced magneto-optic Kerr effect images that show an example writing processes similar to FIGS. 9a-9d, now in a specific example device constructed from Ta/CoFeB/MgO layers. FIGS. 9e, 9f, 9g, and 9h correspond to the switching process in FIGS. 9a, 9b, 9c, and 9d, respectively. This example device is identical to that described above in relation to FIGS. 8e-h. FIG. 9e shows the magnetization direction of each element before applying the current. The magnetization directions of the pinning site A 650 and the pinning site B 660 are in the "down" direction (as indicated by light shading) and the "up" direction (as indicated by dark shading), respectively, and the magnetization direction of the free layer 630 is "down". With applying the negative writing current (in the −x-direction), the "up" domain expands and the "down" domain shrinks, which results in domain wall motion along the current flow direction as shown in FIGS. 9b, 9c, and 9d. When the domain wall reaches another tapered region on the opposite end of free layer 630, the switching process is completed and the free layer is switched from "down" to "up". Further increasing the magnitude or duration of applied current does not move the domain wall toward the pinning site A 650. Therefore, the domain wall does not annihilate and is protected after the switching process.

In summary, example embodiments of the present disclosure describe a SOT magnetic memory and operation method that utilize SOT driven domain wall motion to achieve subsequent switching without the need for an external assist magnetic field. It should be understood that various adaptations and modifications may be made to the above-discussed techniques. For example, while it is discussed that the domain wall motion direction is along the current direction, it should be understood that the domain wall motion direction with respect to the current flow direction may be altered by a choice of the SOT layer and/or a configuration of SOT and the free layer. While it is discussed that the magnetization directions of the pinning site A and the pinning site B are in the "down" direction and "up" direction, respectively, it should be understood that this may be reversed (i.e. the magnetization directions of the pinning site A and the pinning site B may be in the "up" direction and "down" direction, respectively). Likewise, the magnetization direction of the reference layer may be in the "down" or "up" direction.

While it is discussed above that the free layer may be a CoFeB alloy, such as $Co_{40}Fe_{40}B_{20}$, it should be understood that other alloys, including other CoFeB alloys such as $Co_{60}Fe_{20}B_{20}$, cobalt-iron (CoFe) alloy, cobalt-iron (CoFe), and the like may be used. In general, the material choices for the free layer and reference layer can be, but are not restricted to, any of a variety of ferromagnetic materials and their alloys and multilayers, ferrimagnetic materials and their alloys and multilayers, and ferromagnetic or ferrimagnetic insulators. The free and reference layers can be a magnetic single layer or a combination of magnetic layers and non-magnetic layers.

While it is discussed above that the SOT layer may be Ta, it should also be understood that the SOT layer may alternatively be tungsten (W), platinum (Pt), or other materials. In general, the SOT layer can be any material with a sufficient ability to exert SOT, and the material choices for the SOT layer can be, but not restricted to, normal metals, heavy metals, metallic alloys, topological insulators, 2-dimensional electron gas, Weyl semi-metal, metallic multilayers, or a combination of the above. The tunnel barrier can be, but is not restricted to, any oxide or other insulating or nonmagnetic materials. Further, while it was discussed above that the materials in a specific example device were grown using sputtering, it should be understood that a variety of other metal and oxide growth techniques may be utilized. Annealing conditions may also vary. While, a patterning technique using electron beam lithography and Ar ion etching is mentioned above, it should be understood that various other techniques, including photolithography, focused ion beam etching, etc. may be used.

Furthermore, it should be understood that in the above description when value ranges are discussed, it is intended that the ranges cover and teach all possible sub-ranges as well as individual numerical values within the ranges. That is, the end points of a range should not be interpreted as inflexible limitations. For example, a description of a range of 1% to 5% should be interpreted to disclose sub-ranges such as 1% to 2%, 1% to 3%, 1% to 4%, 2% to 3% etc., as well as individually values within the range such as 1%, 2%, 3%, 4% and 5%.

In generally, it should be understood that the various elements described above may be made from differing materials, implemented in different combinations or otherwise formed or used differently without departing from the intended scope of the disclosure. Example embodiments are not necessarily mutually exclusive as some may be combined with one or more embodiments to form new example embodiments. It will be appreciated by a person skilled in the art that other variations and/or modifications may be made to the specific embodiments without departing from the scope of the invention. The present embodiments are, therefore, to be considered in all respects to be illustrative and not restrictive.

What is claimed is:

1. A magnetic memory comprising:
    a magnetic tunnel junction (MTJ) that includes a reference layer, a tunnel barrier layer and a free layer, the tunnel barrier layer positioned between the reference layer and free layer;
    a spin-orbit torque (SOT) layer disposed adjacent to the free layer; and
    a pair of pinning sites, each pinning site positioned at a longitudinal end of the free layer and having an opposite magnetization direction from each other,
    wherein the SOT layer is configured to exert SOT and switch a magnetization direction of the free layer via domain wall motion in a direction of current flow when an electric current is passed through a length of the SOT layer.

2. The magnetic memory of claim 1, wherein the free layer includes tapered regions at the longitudinal ends meeting the pinning sites, wherein the tapered regions have at least one of a tapered width or a tapered thickness such that the pair of pinning sites are at least one of wider or thicker than a portion of the free layer.

3. The magnetic memory of claim 2, wherein the tapered regions have a tapered width such that the pair of pinning sites are wider than the portion of the free layer.

4. The magnetic memory of claim 3, wherein the SOT layer is also tapered at its longitudinal ends such that the longitudinal ends of the SOT layers are wider than the portion of the free layer.

5. The magnetic memory of claim 2, wherein the tapered regions have a tapered thickness such that the pair of pinning sites are thicker than the portion of the free layer.

6. The magnetic memory of claim 2, wherein the tapered regions have both a tapered thickness and a tapered width such that the pair of pinning sites are both wider and thicker than the portion of the free layer.

7. The magnetic memory of claim 1, wherein the SOT layer is configured to switch the magnetization direction of the free layer in the absence of an assist magnetic field.

8. The magnetic memory of claim 1, wherein the pinning sites are configured to provide non-homogenous magnetic anisotropy with respect to the free layer.

9. The magnetic memory of claim 1, wherein at least one of the SOT layer or the free layer is configured to provide non-uniform current density throughout a length thereof.

10. The magnetic memory of claim 1, wherein the magnetized state of the free layer is based on the direction of current flow and on magnetization direction of the pinning sites.

11. The magnetic memory of claim 1, further comprising a device protection layer disposed over the reference layer.

12. The magnetic memory of claim 1, further comprising a first terminal electrically connected to the reference layer, a second terminal electrically connected to the pinning site at one longitudinal end of the SOT layer, and a third terminal electrically connected to the pinning site that the other longitudinal end of the SOT layer.

13. The magnetic memory of clause 12, wherein passing electric current through the second and third terminals allows the electric current to be passed through the length of the SOT layer.

14. The magnetic memory of claim 1, wherein the reference layer is biased at a reference magnetic state.

* * * * *